United States Patent

Kimura et al.

[11] Patent Number: 5,819,166
[45] Date of Patent: Oct. 6, 1998

[54] RECEIVING APPARATUS HAVING A DATABASE CONTAINING BROADCASTING-STATION INFORMATION

[75] Inventors: Toshiyuki Kimura; Yutaro Ishikawa, both of Kawagoe, Japan

[73] Assignee: Pioneer Electronic Corporation, Tokyo, Japan

[21] Appl. No.: 576,040

[22] Filed: Dec. 21, 1995

[30] Foreign Application Priority Data

Jan. 26, 1995 [JP] Japan .................................... 7-010340

[51] Int. Cl.⁶ .................................................. H04B 1/18
[52] U.S. Cl. .................................. 455/186.1; 455/184.1
[58] Field of Search .......................... 455/186.1, 185.1, 455/184.1, 161.1, 186.2, 161.2, 161.3

[56] References Cited

U.S. PATENT DOCUMENTS

| | | | |
|---|---|---|---|
| 4,969,209 | 11/1990 | Schwob | 455/158 |
| 5,086,511 | 2/1992 | Kobayashi et al. | 455/186.1 |
| 5,152,011 | 9/1992 | Schwob | 455/158.5 |
| 5,152,012 | 9/1992 | Schwob | 455/158.5 |
| 5,393,713 | 2/1995 | Schwob | 455/158.5 |
| 5,471,662 | 11/1995 | Shiota | 455/186.1 |
| 5,537,674 | 7/1996 | Kishimoto et al. | 455/186.1 |
| 5,732,338 | 3/1998 | Schwob | 455/158.5 |

FOREIGN PATENT DOCUMENTS 1-117529  5/1989  Japan .
2-238724  9/1990  Japan .

OTHER PUBLICATIONS

United States RBDS Standard for Broadcast Data Systems Draft No. 1.4 NRSC Document, pp. 10–11,14, 22–24, Jan. 10, 1992.

*Primary Examiner*—Nguyen Vo
*Attorney, Agent, or Firm*—Morgan, Lewis & Bockius LLP

[57] ABSTRACT

A receiving apparatus has a database containing broadcasting-station information. A controller in this receiving apparatus determines based on the storage contents of a memory that a reception frequency set to be tuned matches with reception frequencies of a plurality of broadcasting stations in a predetermined geographical range when the reception position lies within the predetermined geographical range. When the reception of broadcast waves is detected in the tuning operation, the controller determines that the set reception frequency is the reception frequency of a multistation. When the set reception frequency is determined as the reception frequency of the multistation, the controller selects information associated with one of a plurality of broadcasting stations which uses that reception frequency, based on the storage contents of the memory and sequentially stores the selected broadcasting-station information together with the reception frequency as the reception history of the multistation in association with the predetermined geographical range.

9 Claims, 10 Drawing Sheets

| GRIDS | CALL SIGNS (PI) | FORMATS (PTY) | RECEPTION FREQUENCIES | | | CITIES | STATES |
|---|---|---|---|---|---|---|---|
| g1 | ST11 | JAZZ | fA | | | — | |
| g2 | ST21 | NEWS | fB | | | — | |
| g3 | — | — | — | | | — | SI (IOWA) |
| g4 | ST41 | CLASS-ICAL | fC | | | — | |
| g5 | ST51 | NEWS | fD | | | C11 | |
| | ST52 | POPS | fE | | | | |
| g6 | ST61 | ROCK | fF | | | — | |
| g7 | ST71 | ROCK | fG | | | — | |
| | ST72 | NEWS | fH | | | | |
| | ST73 | TALK | fI | | | | |
| g8 | ST81 | JAZZ | fJ | | | — | |
| | ST82 | POPS | fK | | | | |
| g9 | — | — | — | | | C23 | S2 (ILLINOIS) |

*FIG. 3*

| FORMATS | CALL SIGNS | RECEPTION FREQUEN-CIES | RECEPTION LEVELS |
|---|---|---|---|
| NEWS | | | |
| ROCK | | | |
| TALK | | | |
| JAZZ | | | |

FIG. 8

| $g_{n+20}$ | $g_{n+21}$ | $g_{n+22}$ | $g_{n+23}$ | $g_{n+24}$ |
|---|---|---|---|---|
| $g_{n+19}$ | $g_{n+6}$ | $g_{n+7}$ | $g_{n+8}$ | $g_{n+9}$ |
| $g_{n+18}$ | $g_{n+5}$ | CURRENT GRID $g_n$ | $g_{n+1}$ | $g_{n+10}$ |
| $g_{n+17}$ | $g_{n+4}$ | $g_{n+3}$ | $g_{n+2}$ | $g_{n+11}$ |
| $g_{n+16}$ | $g_{n+15}$ | $g_{n+14}$ | $g_{n+13}$ | $g_{n+12}$ |

FIG. 10

RECEIVING APPARATUS HAVING A DATABASE CONTAINING BROADCASTING-STATION INFORMATION

BACKGROUND OF THE INVENTION

1. Field of the Invention

The present invention relates to a receiving apparatus for receiving broadcast waves, and, more particularly, to a receiving apparatus with a database containing broadcasting-station information which identifies the broadcasting station and the type of a broadcasting program in association with the reception frequency.

2. Description of the Related Art

One known database type of receiver includes a non-volatile memory like ROM (Read-Only Memory) previously having stored identification (ID) data, such as broadcasting stations whose broadcast waves are to be received (hereinafter referred to as "target broadcasting stations") and the types of broadcasting programs to be received. The ID data is stored as broadcasting-station information in association with reception frequencies and reception areas (e.g., the areas obtained by segmenting the whole area of the U.S.A. into subareas of 0.5 degree in both the longitudinal and latitudinal directions; such segments are called "grids"). The receiver builds a database of the memory and performs a database retrieval process of accessing this memory at the time of actually receiving broadcast waves. As a result of the accessing, the receiver reads ID data, such as the broadcasting station and/or the type of a broadcasting program associated with both of the grid corresponding to the reception position and the set reception frequency. The receiver then displays the name of that broadcasting station (e.g., its call sign) and the type of the broadcasting program (e.g., rock-and-roll, jazz or news; this type is called "format") on the basis of the read data. To tune to the type of the broadcasting program a user desires, this receiver executes reception frequency control (hereinafter called "format search") based on the data stored in the database memory. For example, Japanese Unexamined Patent Publication No. Hei 1-117529 discloses a receiver having those functions.

The retrieval process will now be discussed more specifically. When the setting of the reception frequency is established, the broadcasting-station information data associated with the grid corresponding to the reception position or the current position of the receiver (hereinafter called "current grid") are candidates for the receiver's searching or retrieving. The receiver then extracts data corresponding to the set reception frequency from the candidates, and the resultant extracted data is used as the target broadcasting-station information. Depending on the geographical positional relation among broadcasting stations (transmitting stations), however, different broadcasting stations (multistation) which use the same reception frequency may be located within the same grid. With regard to a data retrieval process in such a case, the above mentioned publication discloses the system which informs the presence of a multistation after attaining all the broadcasting-station information associated with the current grid and the set reception frequency, sequentially selects one piece of information from the attained broadcasting-station information to switch the broadcasting-station information to be used (displayed) every time the user performs a certain key operation, so that the receiver accomplishes to search out the target information on the actually receiving and listening to a broadcasting program (particularly, see page 13, the upper left column, line 15 to the upper right column, line 20).

Every time radio waves from a multistation are received, this conventional receiver demands that a user should perform the specific operation of selecting the broadcasting-station information of the currently receiving broadcast waves. Since the specific operation is troublesome, it become the user's burden. Suppose that broadcast waves from a multistation A consisting of a broadcasting station a and a broadcast station b each of which uses the same reception frequency are received, the broadcasting-station information to be presented or displayed for selection is associated with a single broadcasting station, the broadcasting-station information about the broadcasting station a is presented or displayed first for the selection, the presented or displayed information is switched to the broadcasting-station information about the broadcasting station b, and back to that about the broadcasting station a and so forth every time a certain key operation is performed. A user can once select the information associated with the broadcasting station b on the basis of the presented information. When broadcast waves from the multistation A are received again later, however, the broadcasting-station information about the broadcasting station a is presented first though the user has selected the information about the broadcasting station b before. It is therefore likely that the user should frequently repeat the same selecting operation as has been done previously.

In the above format search, since the broadcast waves of a specified program type are received at random based on the database, the received broadcast waves of a program type desired by the user may be poor in sensitivity.

It is also found that, according to this type of format search, simple reception of the broadcast waves of the desired program type for the current grid is insufficient to receive and listen to broadcasting programs in good conditions.

SUMMARY OF THE INVENTION

Hence, with a view to solving the above problems, the present invention was accomplished, and it is a primary object of the present invention to provide a receiving apparatus capable of responding to the broadcasting program desired by a user as adaptively as possible. More specifically, the primary object of this invention is to provide a receiving apparatus capable of easily presenting broadcasting-station information which matches with a broadcasting program received upon the reception of broadcast waves from a multistation without requiring an operation by the user. It is another object of this invention to provide a receiving apparatus for executing a format search which can attain broadcasting programs of the program type desired by the user efficiently and with a high sensitivity.

According to a first aspect of this invention, there is provided a receiving apparatus having a database containing broadcasting-station information, which comprises: a database memory being previously stored broadcasting-station information consisting of at least three types of data including identification data on broadcasting stations, identification data on program types available from the broadcasting stations and reception frequency data on broadcast waves emitted from the broadcasting stations, in association with geographical positional information; tuning means for tuning to broadcast waves at a set reception frequency; multistation reception determining means for determining that the set reception frequency is a reception frequency of a multistation in a case where a reception position lies within a predetermined geographical range, the reception frequency set in the tuning means matches with a reception frequency used by a plurality of broadcasting stations in the predetermined geographical range on the basis of data stored in the database memory and reception of broadcast waves by tuning by the tuning means is detected; selection means for, when the reception frequency of the multistation has been determined, selecting broadcasting-station information associated with one of the plurality of broadcasting stations using that reception frequency, based on data stored in the database memory; and a history memory for sequentially storing the broadcasting-station information selected by the selection means together with the reception frequency.

According to the receiving apparatus applied with the first aspect with a database containing broadcasting-station information, in a case where a reception position lies within a predetermined geographical range, the reception frequency set for the tuning purpose matches with a reception frequency used by a plurality of broadcasting stations in the predetermined geographical range on the basis of data stored in the database memory and the reception of broadcast waves by tuning is detected, the set reception frequency is determined as the reception frequency of a multistation. When the reception frequency of the multistation has been determined, broadcasting-station information associated with one of those broadcasting stations using that reception frequency is selected based on data stored in the database memory, and the selected broadcasting-station information is sequentially stored together with the reception frequency as a reception history of the multistation.

A second aspect of the present invention provides a receiving apparatus having a database containing broadcasting-station information, comprising: a database memory in which broadcasting-station information consisting of at least three types of data has been previously stored in association with geographical positional information, identification data on broadcasting stations, the three types of data including identification data on program types available from the broadcasting stations and reception frequency data on broadcast waves emitted from the broadcasting stations; tuning means for tuning to broadcast waves at a set reception frequency; means for generating an instruction for storing broadcasting-station information including a reception frequency in association with a specified program type; means for setting a reception frequency in the tuning means while sweeping the reception frequency in response to the instruction; means for detecting that broadcast waves have been received by tuning of the tuning means during sweeping; and a program-type associated memory for, when reception of broadcast waves is detected, reading broadcasting-station information having the specified program type and the reception frequency of the received broadcast waves from the database memory and storing the read broadcasting-station information in association with a reception level of the broadcast waves.

According to this receiving apparatus applied with the second aspect, broadcast waves of the specified program type are received, broadcasting-station information having the specified program type and the reception frequency of the received broadcast waves is read out from the database memory, and the read information is stored to the program-type associated memory in associated with reception level of the received broadcast waves.

A third aspect of the present invention provides a receiving apparatus having a database containing broadcasting-station information, comprising: a database memory in which broadcasting-station information consisting of at least three types of data has been previously stored in association with geographical positional information, the three types of data including identification data on broadcasting stations, identification data on program types available from the broadcasting stations and reception frequency data on broadcast waves emitted from the broadcasting stations; tuning means for tuning to broadcast waves at a set reception frequency; means for generating an instruction for receiving a broadcasting program corresponding to a specified program type; means for setting a reception frequency in the tuning means while sweeping the reception frequency in response to the instruction; means for detecting that broadcast waves have been received by tuning of the tuning means during sweeping; and retrieval means for, when reception of broadcast waves is detected, reading broadcasting-station information having the specified program type and the reception frequency of the received broadcast waves from the database memory, whereby the retrieval means first retrieves broadcasting-station information having the specified program type and a reception frequency of received broadcast waves among from one or more pieces of broadcasting-station information associated with at least one predetermined unit geographical ranges including a reception position of the receiving apparatus, the one or more pieces of broadcasting-station being stored in the database memory, and when the broadcasting-station information having the specified program type and the reception frequency of received broadcast waves is not obtainable in the first retrieval, the retrieval means further retrieves broadcasting-station information having the specified program type and the reception frequency of received broadcast waves among from one or more pieces of broadcasting-station information associated with a geographical range around the predetermined unit geographical ranges including the reception position of the receiving apparatus.

According to this receiving apparatus applied with the third aspect, broadcasting-station information (target information) having the specified program type and the received broadcast waves is searched among from one or more pieces of broadcasting-station information corresponding to at least one predetermined unit geographical range including the receiving position on the basis of data stored in the database memory. In result, if no target information is acquired, the object to be searched is spread wider than the predetermined geographical range and the searching of the target information is performed again.

BRIEF DESCRIPTION OF THE DRAWINGS

FIG. 3 shows a memory table illustrating the correlation among individual pieces of data stored in the database memory in the receiving apparatus shown in FIG. 1;

FIG. 8 shows a memory table illustrating the correlation among individual pieces of data stored in a format BSM memory included in the receiving apparatus shown in FIG. 1;

FIG. 10 is an schematic diagram showing the way the retrieval of the specified format and the reception frequency from the database is carried out in the process illustrated in FIG. 9.

DETAILED DESCRIPTION OF THE PREFERRED EMBODIMENT

A preferred embodiment of the present invention will now be described with reference to the accompanying drawings.

Figure 1:
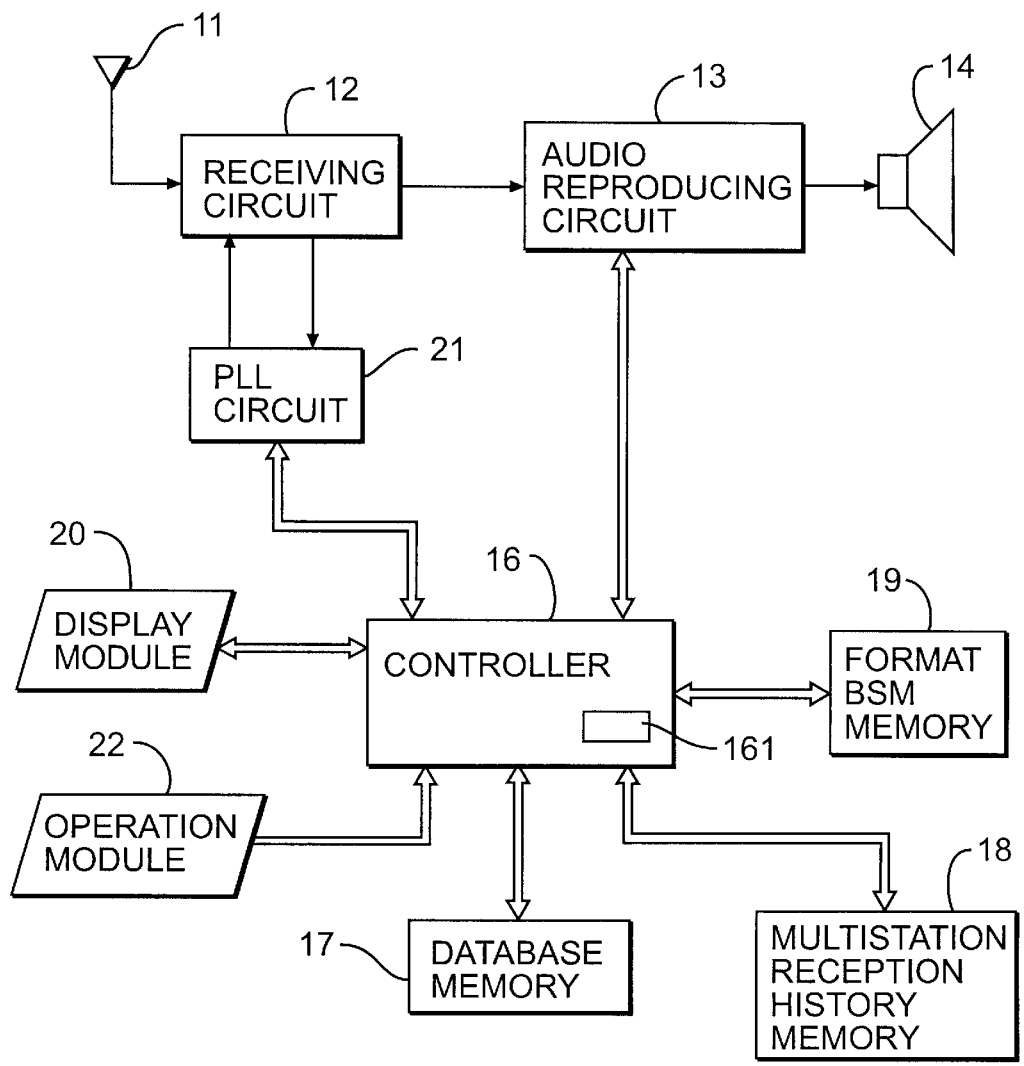
FIG. 1 is a block diagram showing the basic structure of a database type receiving apparatus according to one embodiment of this invention.

FIG. 1 shows the basic structure of a database type receiving apparatus according to one embodiment of this invention.

Referring to FIG. 1, a radio-wave receiving antenna 11 catches broadcast waves including audio signals, and supplies the received waves as a received signal to a receiving circuit 12 as a tuner (tuning means). The receiving circuit 12 includes a high-frequency amplifier and a frequency converter, which constitute the front end. The receiving circuit 12 tunes to the received signal at the set reception frequency to acquire a signal of a predetermined intermediate frequency. The intermediate-frequency signal from the receiving circuit 12 is supplied to an audio reproducing circuit 13 which performs a predetermined signal processing, such as intermediate frequency amplification, demodulation (FM detection, AM detection or the like), low frequency amplification and multiplexing. The processed signal from the audio reproducing circuit 13 serves as a drive signal for a loudspeaker 14. A controller 16 controls an access to a memory 17, constituted of a non-volatile memory like ROM, which is a database having broadcasting-station information for identifying broadcasting stations and the types of broadcasting programs as mentioned earlier.

The database format in the memory 17 is such that detailed information of all broadcasting stations which emit broadcast waves receivable by this receiver is stored in association with identification (ID) information on the locations of the broadcasting stations (i.e., the sites from which radio waves are broadcast and which include the locations of the broadcasting towers). There are various possible storage formats one of which is exemplified in FIGS. 2 and 3. The database described in the aforementioned Japanese patent publication may be adapted to the memory 17.

Figure 2:
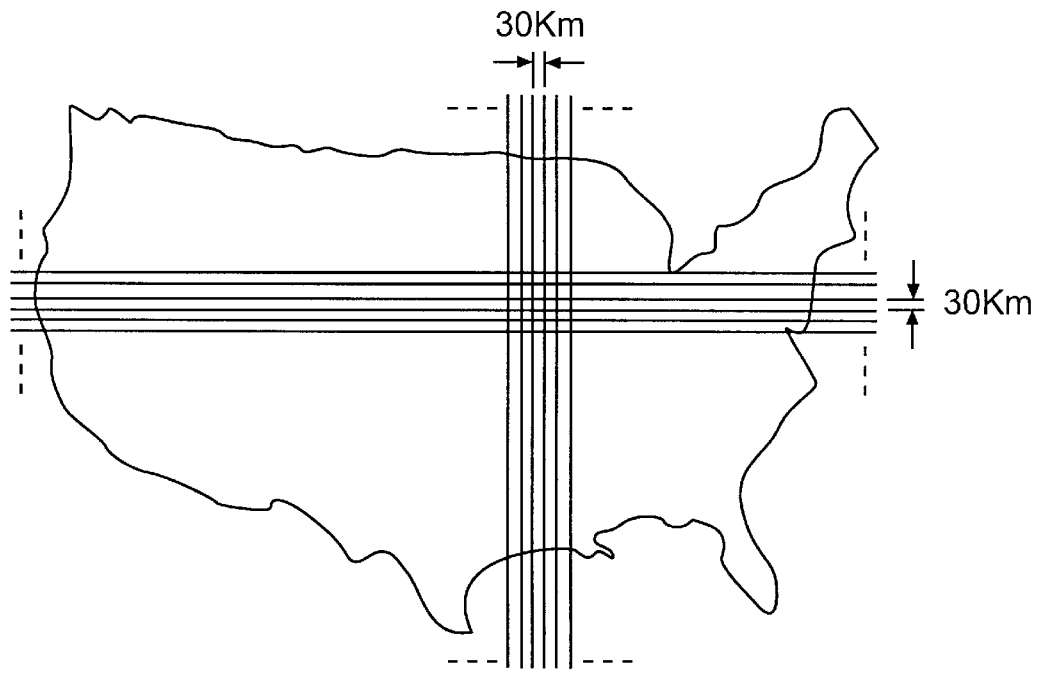
FIG. 2 is a diagram showing the relationship between broadcasting-station information stored in a database memory in the receiving apparatus shown in FIG. 1 and geographic information.
Figure 2:
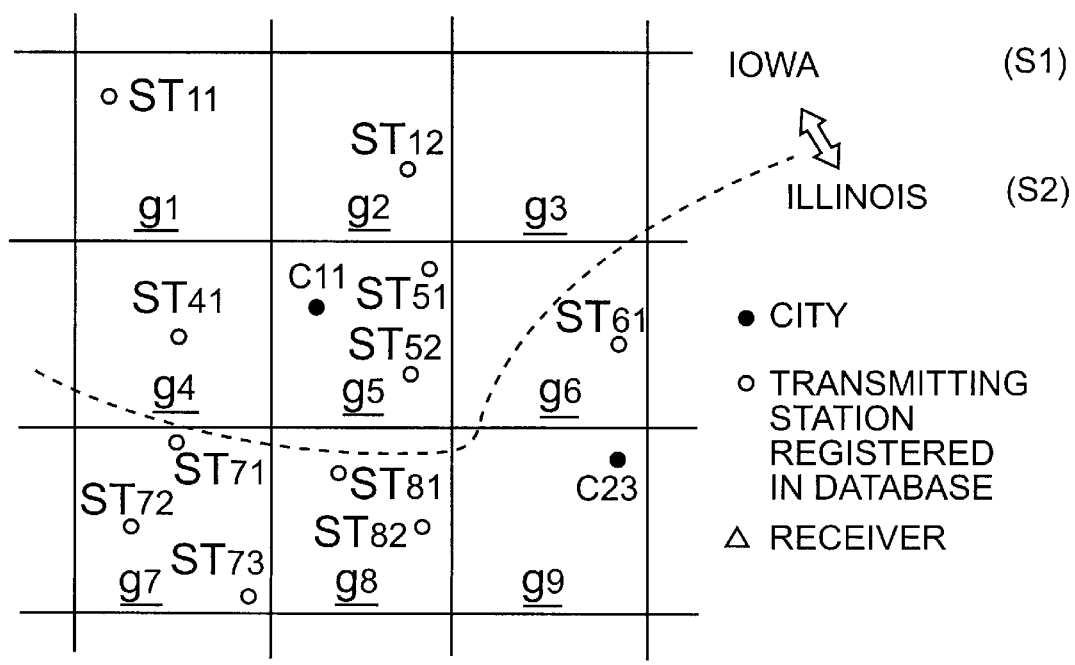

FIG. 2 shows a schematic map of the U.S.A. and a part of that map in an enlarged form. In this example, the mainland of the U.S.A. is divided to areas of a predetermined distance square, the distance being e.g., 30 Km (those areas will hereinafter be called "grid areas"). The grid areas are managed as geographical data. The grid areas are coded so as to indicate the positions of the broadcasting stations and the position of the receiver on the map. With reference to the enlarged view showing grid areas g1 to g9, for example, it has been known since the data writing in the ROM that eleven broadcasting stations $ST_{11}$ to $ST_{82}$ exist in those nine grid areas. Therefore, the database memory 17 can store the ID information of the broadcasting stations located in each grid area with the call sign codes of the stations, code by code (grid code) that identifies the associated grid area, as shown in a memory table in FIG. 3. If the receiver is located in the grid area g5 as shown in FIG. 2, the presence of the broadcasting stations $ST_{51}$ and $ST_{52}$ in the grid area containing the receiver can be known by referring to the data stored in the database memory 17.

Besides the call sign codes for identifying broadcasting stations, format codes for identifying the programs provided by the broadcasting stations and the reception frequency codes of the broadcast waves emitted from that broadcasting station are stored in the database memory 17 in association with the call sign codes. The "format" is the term used in so-called in-receiver database systems, and serves to identify the attribute, type, classification or property of each program. For example, the "format" indicates a talk program, classical music or the like as shown in FIG. 3. Further, there are stored codes for identifying cities and codes for identifying states for convenient retrieval of a target code (particularly grid code) in the database memory 17. Those city and state ID codes are stored in such a manner that, for example, the grid areas g1 to g5 belong to Iowa state (S1), the grid areas g6 to g9 belong to Illinois state (S2), the grid area g5 is associated with a city C11 and the grid area g9 is associated with a city C23.

Figure 4:
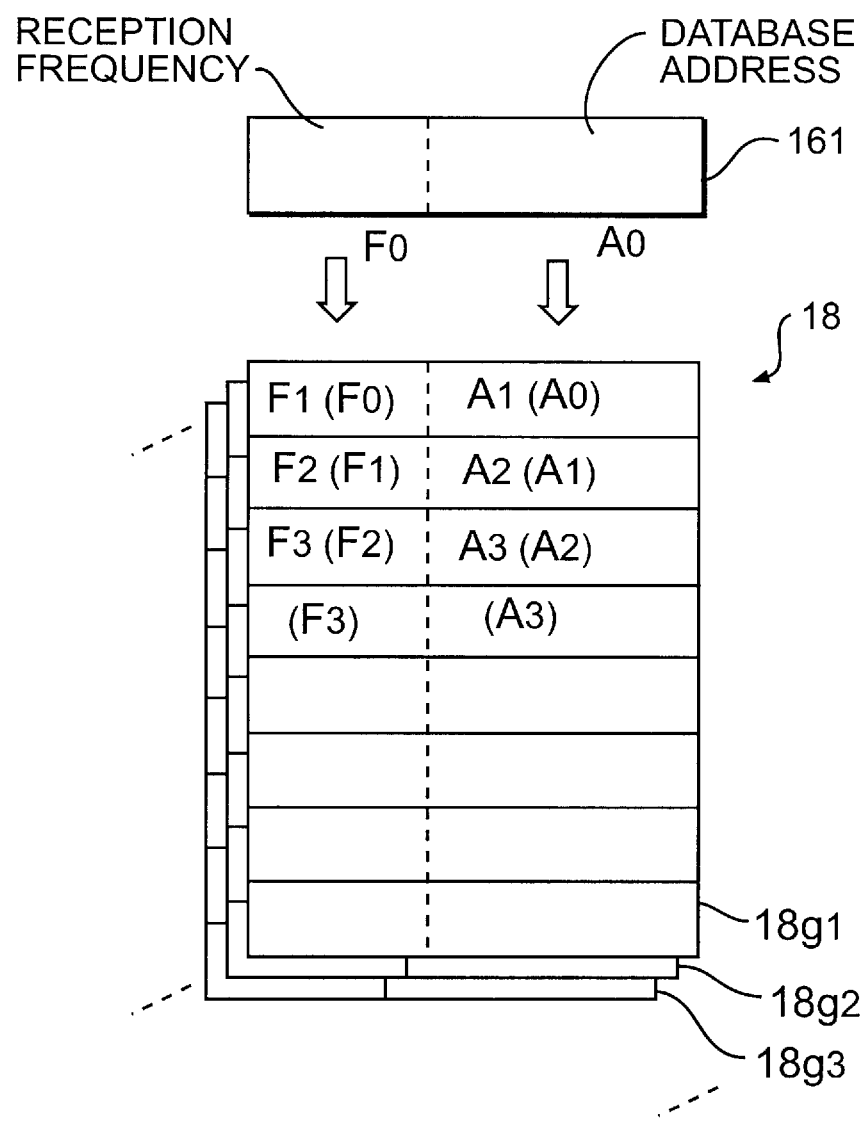
FIG. 4 shows a memory table illustrating the correlation among individual pieces of data stored in a multistation reception history memory and an internal memory of a controller respectively included in the receiving apparatus shown in FIG. 1.

Returning to FIG. 1, the controller 16 has multistation reception determining means for determining that the reception frequency set in the receiving circuit 12 is the reception frequency of a multistation in the case where the reception position lies within a predetermined geographical range based on data stored in the database memory 17, the reception frequency set in the receiving circuit 12 matches with the reception frequency used by a plurality of broadcasting stations in the predetermined geographical range and the reception of broadcast waves by the receiving circuit 12 is detected. The controller 16 includes an internal memory 161 for temporary storage of the address in the database memory 17, the address specifying the broadcasting-station information selected by a user. A multistation reception history memory 18 consists of, for example, FIFO (First-In First-Out) type memory. When the reception frequency of such a multistation is determined or at the time of receiving broadcast waves from the multistation, the controller 16 performs access control on the multistation reception history memory 18, in association with the internal memory 161. The history memory 18 and the internal memory 161 may employ the storage formats as shown in FIG. 4. In FIG. 4, the reception frequency codes and database addresses are stored in both memories in association with each other, and the data temporarily stored in the internal memory 161 is stored in the history memory 18. The history memory 18 stores particular data for acquiring broadcasting-station information of a multistation from the database memory 17 grid by grid. (The particular data are a memory address for the broadcasting-station information of interest stored in the database memory 17, and are considered as a kind of broadcasting-station information.) The detailed accessing to the memories 161 and 18 will be discussed later.

The controller 16 also controls access to a format BSM memory 19 whose storage format and access control will be specifically discussed later.

A display module 20 displays the operational status of this receiver including information association with the received program (station name or call sign and program type or the like). The display operation is executed under the control of the controller 16. An operation module 22 is used by the user to perform various instruction operations, such as an operation to designate a preset channel to be received, an operation to select one of plural pieces of broadcasting-station information which seems to correspond to the received broadcasting program at the time broadcast waves are received from a multistation, and an operation to specify the type of a program to be received.

A PLL (Phase-Locked Loop) circuit 21 supplies a frequency control signal corresponding to the station selection data from the controller 16 to the receiving circuit 12 in order to set the tuning frequency (reception frequency) in accordance with the station selection data. More specifically, the PLL circuit 21 compares the phase of the output signal of a VCO (Voltage-Controlled Oscillator) for frequency conversion incorporated in the receiving circuit 12 with the phase of a signal corresponding to the station selection data from the controller 16, and controls the oscillation frequency of the VCO in the receiving circuit 12 based on a control signal according to the comparison result or the difference between both phases.

Processes which characterize the above-described receiving apparatus and are executed by the controller 16 will be described below.

I. Process in Response to Multistation Reception

This process will be explained with reference to the flowchart in FIG. 5.

Before entering this flowchart, when a new reception frequency is set or a so-called scan command for activating the sweeping of the reception frequency is generated through the operation module 22, the controller 16 sets the new reception frequency to the receiving circuit 12 via the PLL circuit 21. When the tuning to the set reception frequency in the receiving circuit 12 is performed next, it is discriminated that broadcast waves have been received; the "broadcast waves" are radio waves transmitted from a broadcasting station. That is, the received radio waves are detected as broadcast waves based on, for example, the level of the intermediate frequency signal obtained by an intermediate frequency amplification stage in the audio reproducing circuit 13.

After the detection of the reception of broadcast waves, the controller 16 executes control to read all the broadcasting-station information associated with the set reception frequency and the current grid corresponding to the current reception position, from the database memory 17 or the history memory 18. When the receiver is located in the grid g5 as shown in FIG. 2, for example, the information (call signs, formats, reception frequencies, etc.) associated with the transmitting stations (broadcasting stations) $ST_{51}$ and $ST_{52}$ located in the current grid area is read from the database memory 17. It is then determined if the read broadcasting-station information contains plural pieces of reception frequency data which are equivalent to or match with the set reception frequency. When it is detected that a plurality of broadcasting stations using the same or substantially the same reception frequency as the set one are located in the current grid area, the controller 16 determines that multistation reception is being made and enters the process illustrated in the flowchart in FIG. 5.

In the case where the data of the set reception frequency is present in the memory area ($18_{g5}$) in the history memory 18 which is associated with the current grid, whether or not multistation reception is taking place may be determined by checking the presence of such data in that memory area. The current position (the position of the receiver) is acquired by a measuring system or a current-position information supplying system (neither shown) using, for example, the scheme described in Japanese Unexamined Patent Publication No. Hei 2-238724. The current position may be obtained from the grid specified as the user enters the names of a state and a city through the operation module 22 based on the data correlation as shown in FIG. 3.

Figure 5:
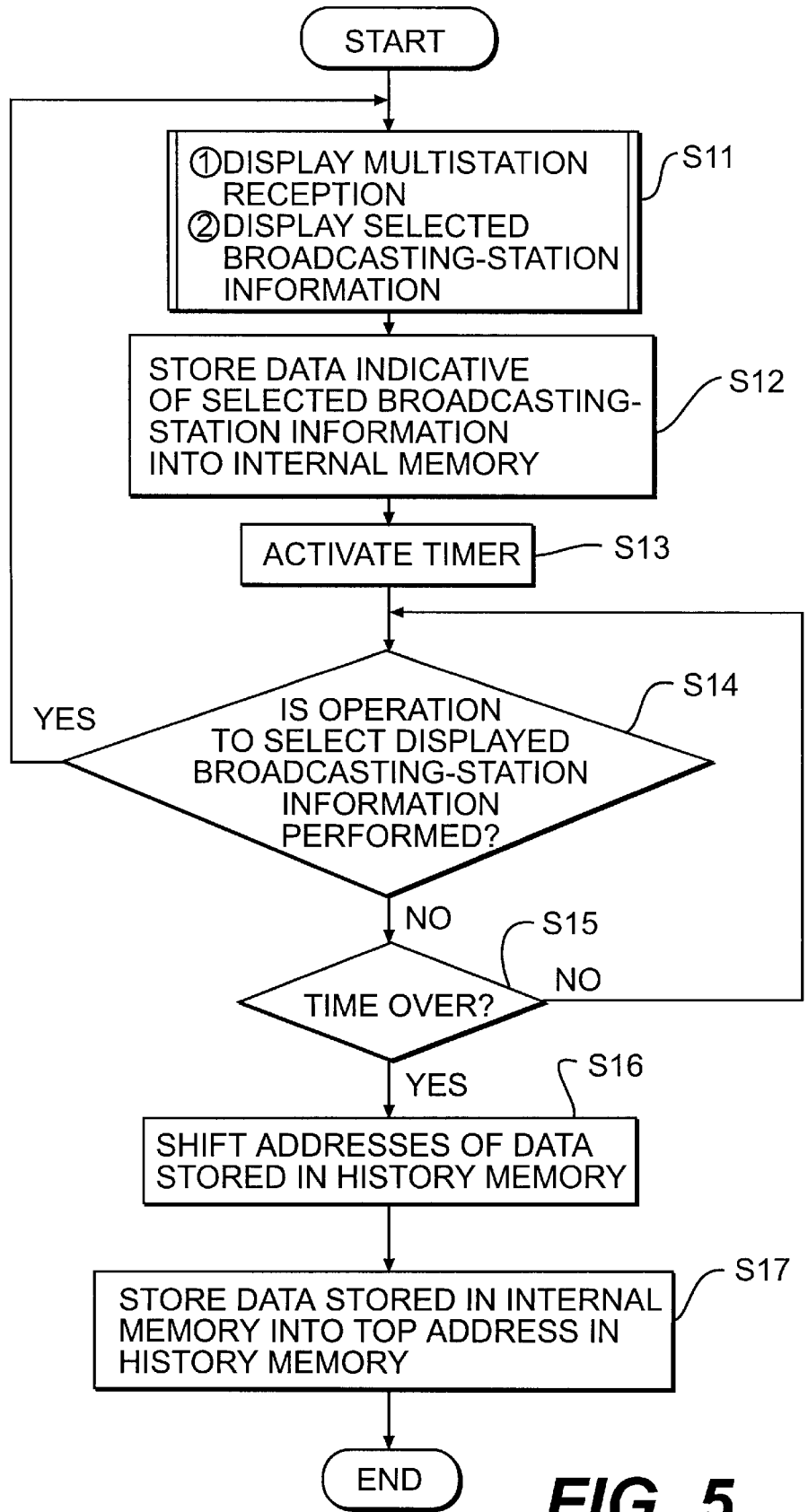
FIG. 5 is a flowchart illustrating a multistation reception responsive process which is executed by the controller in the receiving apparatus shown in FIG. 1.

In FIG. 5, first, the controller 16 displays that the multistation reception is being made to inform the user of the reception, and displays one of plural pieces of read information on the broadcasting stations that use the set reception frequency (step S11). Call signs are the typical broadcasting-station information to be displayed. This user-informing operation may be conducted in an audible manner. The broadcasting-station information which is displayed by the process in the first step S11 in this flowchart is the broadcasting-station information read from the database address stored last in the memory area in the history memory 18 if the data of the set reception frequency is stored in the memory area in the history memory 18 corresponding to the current grid (case a), or the broadcasting-station information read earliest from the database in the database memory 17 if the data of the set reception frequency is not stored in the memory area in the history memory 18 corresponding to the current grid but is stored in the database memory 17 (case b).

Next, data (reception frequency data and database address) indicating the broadcasting-station information displayed in step S11 is stored in the internal memory 161 (step S12). In the case (a), the data stored in the memory area in the history memory 18 corresponding to the current grid is read as data for obtaining the broadcasting-station information to be displayed, and is stored in the internal memory 161. In the case (b), the addresses of the target reception frequency and broadcasting-station information stored in the database memory 17 are read as data for obtaining the broadcasting-station information to be displayed, and are stored in the internal memory 161.

After the step S12, the controller 16 activates a timer for a predetermined time (step S13) and discriminates whether an operation to select the broadcasting-station information to be displayed has been performed through the operation module 22 (step S14). If no such selecting operation has been executed, the controller 16 discriminates if it is the time-over or the predetermined time has elapsed since the operation in step S13 (step S15). When there is no time-over, the flow returns to step S14.

When it is determined in step S14 that a selecting operation to switch the displayed broadcasting-station information to another undisplayed broadcasting-station information has been performed, the flow returns to step S11 to display broadcasting-station information selected by the selecting operation. A description will now be given of the case where after the transition to step S11 from step S14, the process in step S11 is repeated twice or more times in the flowchart. In the case (a), the controller 16 displays broadcasting-station information obtained from data stored at a memory address next to a memory address at which the data of broadcasting-station information having previously displayed in the step S11 is stored in the history memory 18, the next memory address indicating one of memory areas associated with the current grid in the history memory 18, or the controller 16 displays broadcasting-station information having used in the first process of the step S11 in this flowchart when no data are stored at a memory address next to the memory address at which data of broadcasting-station information having previously displayed in the step S11 is stored in the history memory 18. In the case (b), the controller 16 displays the broadcasting-station information read next to the broadcasting-station information previously displayed in step S11 from the database memory 17, or the controller displays the broadcasting-station information that has been used in the first process in step S11 in the flowchart when the database memory 17 has no broadcasting-station information to be read next to the broadcasting-station information previously displayed in step S11.

Through the processes in steps S11 to S15, the broadcasting-station information which has been displayed or selected while one predetermined time of the timer elapses is established as the broadcasting-station information the user searched as the one that matches with the receiving program.

When the established broadcasting-station information is attained, the controller 16 shifts the address of the stored data in the history memory 18 (step S16) to make the memory area at the top address empty and writes the stored data in the internal memory 161 into the empty memory area at the top address (step S17). This operation will be described with reference to FIG. 4. The memory addresses of the reception frequency and database addresses $F_1, A_1$ to $F_3$ and $A_3$ already stored in the history memory 18 are each incremented by "1" and data $F_0$ and $A_0$ stored in the internal memory 161 are stored in the memory area at the top address in the history memory 18 where $F_1$ and $A_1$ have been stored. As a result, data are arranged as indicated by the parentheses in FIG. 4.

The steps S11 to S15 are equivalent to the operation of the selection means in the controller 16, which is executed in cooperation with the operation module 22.

II. Display Process in Response to Setting of Reception Frequency

This process will be explained with reference to the flowchart in FIG. 6.

Before entering this flowchart, when a new reception frequency is set or a so-called scan (seek) command for activating the sweeping of the reception frequency is generated through the operation module 22, the controller 16 sets the new reception frequency in the receiving circuit 12 via the PLL circuit 21. When the tuning to the set reception frequency in the receiving circuit 12 is performed next, it is discriminated that broadcast waves have been received, as done in the above-described process I. After detecting the reception of broadcast waves, the controller 16 enters the process of this flowchart.

Figure 6:
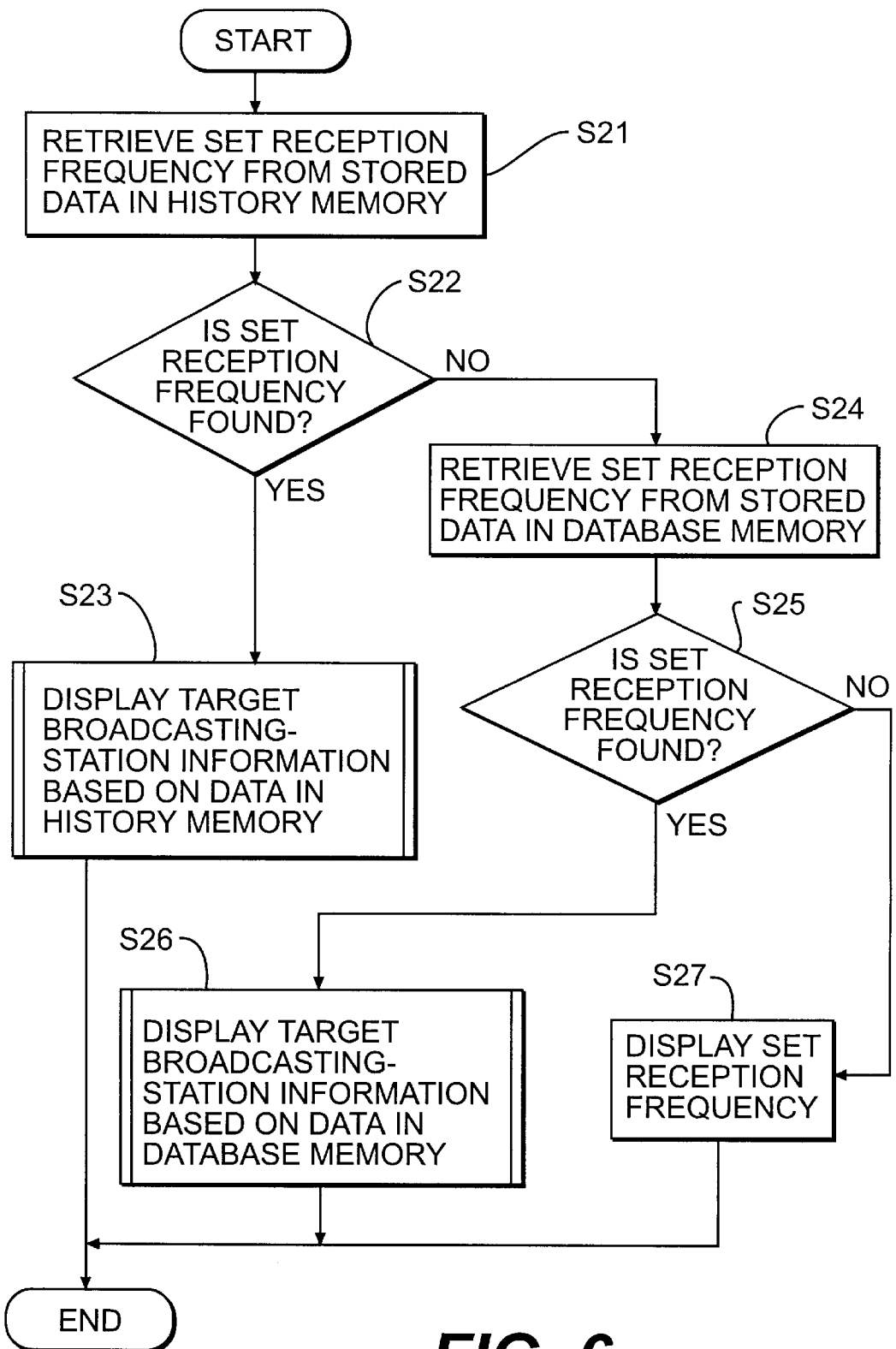
FIG. 6 is a flowchart illustrating a display process which is executed by the controller in the receiving apparatus shown in FIG. 1 in response to the setting of a reception frequency.

In FIG. 6, the controller 16 searches the history memory 18 for the broadcasting-station information which corresponds to the set reception frequency and the current grid corresponding to the current reception position (step S21). Then, the controller 16 determines if the set reception frequency is present (step S22). When the set reception frequency exists, the controller 16 displays the broadcasting-station information obtained from the database address corresponding to the set reception frequency based on the data stored in the history memory 18 (step S23).

When it is determined in step S22 that the set reception frequency does not exist, the controller 16 searches the database memory 17 for the broadcasting-station information which corresponds to the set reception frequency and the current grid corresponding to the current reception position (step S24). Then, the controller 16 determines if the set reception frequency is present (step S25). When the set reception frequency exists, the controller 16 displays the broadcasting-station information corresponding to the set reception frequency based on the data stored in the database memory 17 (step S26).

When it is determined in step S25 that the set reception frequency does not exist, the controller 16 displays only that reception frequency as information associated with the received broadcasting program (step S27).

It should be noted that steps S23 and 26 in this flowchart include the above-described process I in FIG. 5 which is performed in response to the multistation reception. In other words, when multistation reception is detected in both steps, the process goes to step S11 in FIG. 5.

III. Format BSM Process

Figure 7:
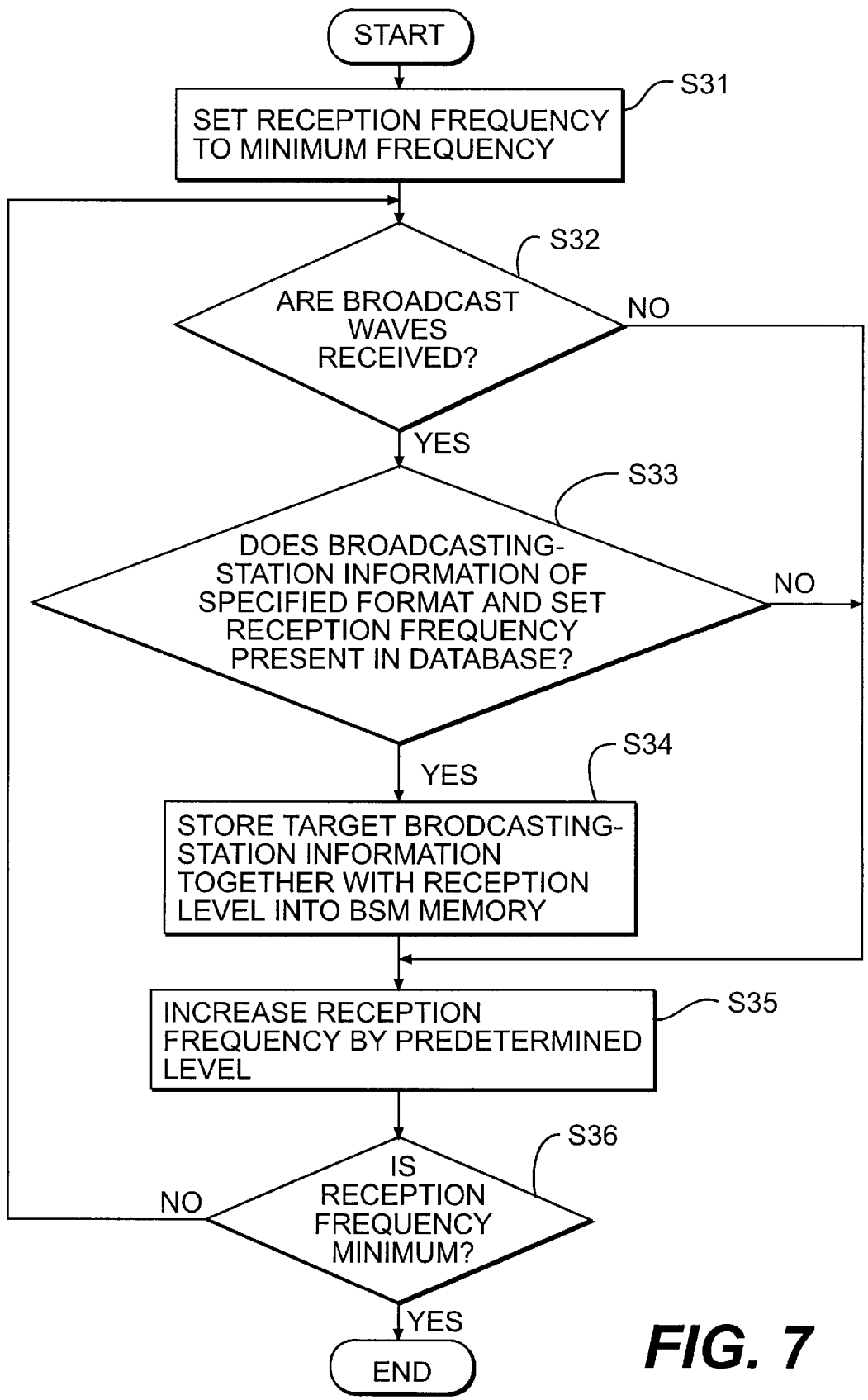
FIG. 7 is a flowchart illustrating a format BSM process which is executed by the controller in the receiving apparatus shown in FIG. 1.

This process will be explained with reference to the flowchart in FIG. 7.

The "format BSM" (Best Stations Memorizing) indicates a function of automatically memorizing (presetting) reception frequencies in the order of a higher reception level to a lower one, format by format, and the format BSM memory 19 shown in FIG. 1 is used for this function. The storage format of this BSM memory 19 is shown in FIG. 8.

Referring to FIG. 8, the BSM memory 19 stores data indicative of the format or program type previously set by the user using the operation module 22. The call signs of individual broadcasting programs having this format, the codes of their reception frequencies and data of reception levels of the received programs are stored in association with the respective format codes.

Returning to FIG. 7, when a format BSM command accompanied with the sweeping of the reception frequency is generated together with the specified format by the operation of the operation module 22, the controller 16 sets the reception frequency of the receiving circuit 12 to the minimum frequency in the receivable frequency band first (step S31). Then, it is determined if the broadcast waves have been received in the same manner as done in the previous processes I and II (step S32). When the broadcast waves have been received, it is determined if the broadcasting-station information about the specified format and the set reception frequency are present in the database memory 17 (step S33). When it is determined in this step S33 that the broadcasting-station information about the specified format and the set reception frequency exist in the database, the reception level then is obtained from the signal from the audio reproducing circuit 13 and the broadcasting-station information corresponding to the set reception frequency is stored together with data corresponding to that reception level in the BSM memory 19 in the order of a higher reception level to a lower one in association with the specified format (step S34).

After this step S34, or after the determination in step S32 that broadcast waves have not been received, or after the determination in step S33 that the target broadcasting-station information is not in the database, the controller 16 increases the reception frequency by a predetermined level through the PLL circuit 21 (step S35). It is then determined whether or not the set reception frequency is the minimum frequency, i.e., whether or not the set reception frequency has exceeded the maximum frequency in step S35 and has returned to the minimum frequency set in step S31 (step S36). When the set reception frequency is not the minimum frequency or when the entire sweeping operation of the reception frequencies is not completed, the flow proceeds to step S32. When the set reception frequency is the minimum frequency, however, this flowchart is terminated.

Through the execution of this flowchart, broadcasting-station information is stored in the BSM memory 19 format by format, and, what is more, the reception level upon receiving broadcast waves of each broadcasting-station information is stored as data. At the time the reception (station selection) operation is performed with respect to the format desired by the user, therefore, if the data stored in the BSM memory 19 is used, a broadcasting program with a higher reception sensitivity or the one with a higher reception level is selected from among the broadcasting programs having the desired format by priority. This station selection is helpful.

IV. Format Seek Process

Figure 9:
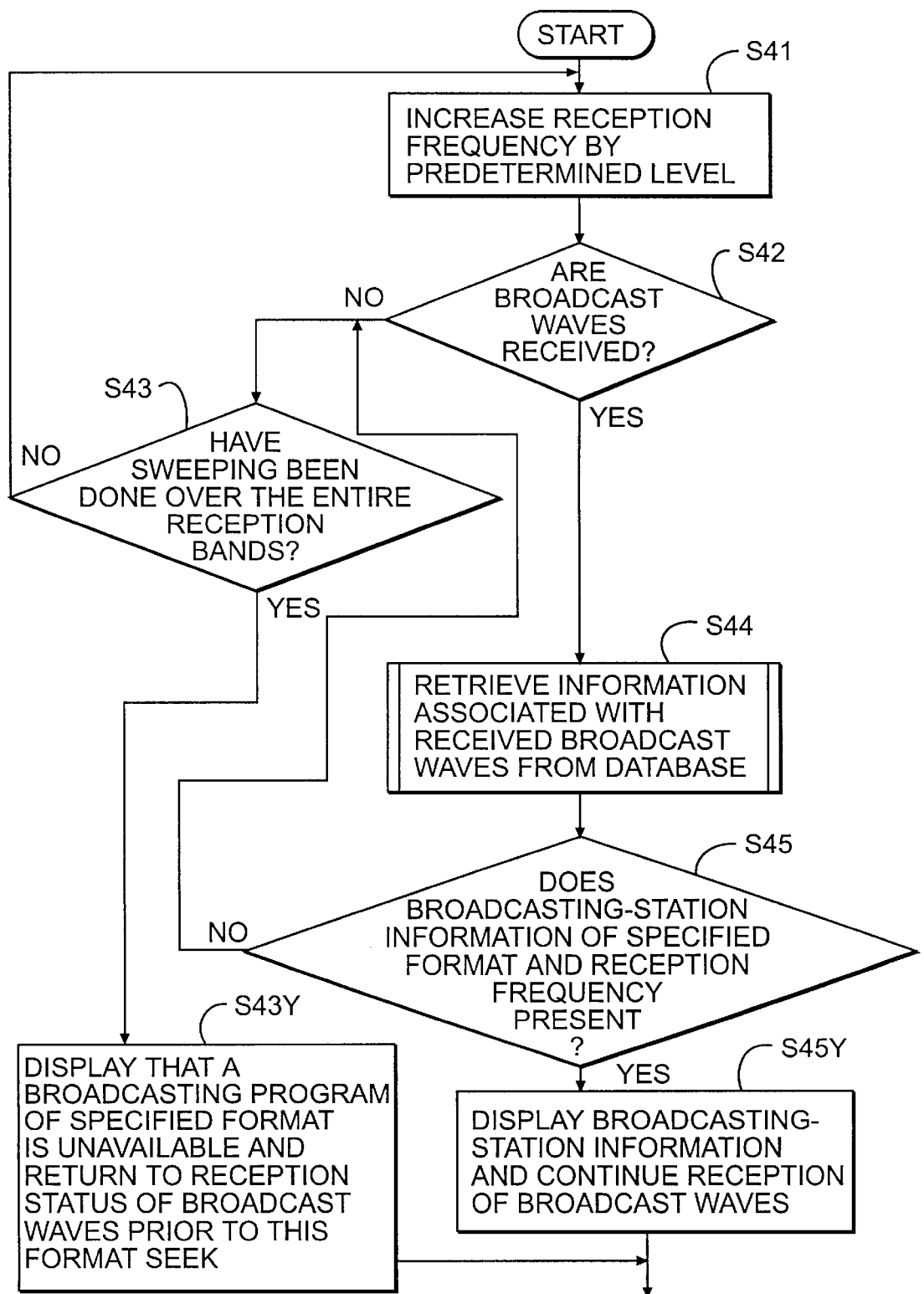
FIG. 9 is a flowchart illustrating a format seek process which is executed by the controller in the receiving apparatus shown in FIG. 1.

This process will be explained with reference to the flowchart in FIG. 9.

Returning to FIG. 9, when a format seek command accompanied with the sweeping of the reception frequency is generated together with the specified format by the operation of the operation module 22, the controller 16 increases the reception frequency by a predetermined level first (step S41), determines if the broadcast waves have been received in the same manner as done in the previous processes (step S42). When no good broadcast waves have been received yet, it is determined if the sweeping operation for the entire reception bands having the receiving circuit 12 has been completed (step S43). When the sweeping has not been completed yet, the flow returns to step S41.

When the reception of broadcast waves is detected in step S42, information associated with the received broadcast waves is retrieved from the database memory 17 (step S44). In this step S44, it is determined based on the data stored in the database memory 17 if there is any broadcasting station which uses the set reception frequency and provides a program of the specified format in the order of the grid areas as shown in FIG. 10 and with respect to a predetermined number of grids determined by the current grid (e.g., 5×5 grids around the current grid). More specifically, if the current grid is located in the center, $g_n$ in FIG. 10, it is determined whether or not the individual pieces of broadcasting-station information associated with the grid $g_n$ has the specified format and the set reception frequency. When the target broadcasting-station information is not found in this grid, the same retrieval operation is then executed for the grid $g_{n+1}$ adjacent to the current grid. Thereafter, the retrieval operation is executed in the same manner grid by grid in the order indicated by the broken line in FIG. 10 until the grid $g_{n+24}$ is reached.

When it is determined in step S45 that the information associated with the specified format and the set reception frequency cannot be attained from the database (NO in step S45), the flow proceeds to step S43 to execute a retrieval process with respect to a newly set reception frequency.

When the information associated with the specified format and the set reception frequency has been attained from the database (YES in step S45), the obtained broadcasting-station information is displayed and the reception operation at the set reception frequency should continue (step S45Y). Thereafter, the process sequence in this flowchart is terminated.

When it is determined in step S43 that the broadcasting-station information of the specified format cannot be acquired from the database even if the sweeping of the reception frequency over the entire reception bands is executed, a message indicating that the broadcasting of the specified format is unavailable, e.g., "NO STATION", is displayed (step S43Y). This visual indication may be replaced with audible informing. In this step S43Y, the reception frequency is set back to the reception frequency which had been set before the format seek in this flowchart started. Thereafter, the process sequence in this flowchart is terminated.

According to the processing of this flowchart, the database retrieval is performed not only for the specified format associated with the current grid but also for grids outwardly adjoining to the current grid, and if broadcasting-station information of the specified format cannot be found from the data about the adjoining grids, the retrieval is further performed for grids located further away by one grid from the current grid. With this scheme, it is possible to cope with the situation where radio waves from one of the broadcasting stations in the adjoining grids have a higher reception (sensitivity) or transmission level than those in the current grid. That is, though the receiver is located in the current grid area, it is possible to surely present the broadcasting station information for receiver receivable in another grid.

The foregoing description of this embodiment has been given with reference to the receiver which conforms to a so-called in-receiver database system having a database containing only data stored in a read-only memory. As one type of such database type receivers, recently, a database type RBDS (Radio Broadcasting Data System) receiver has been proposed, which receives RBDS broadcast waves, and corrects or supplements the database based on the received broadcast waves, to acquire the broadcasting-station information of the received broadcast waves that match with the actual reception conditions or environment. More specifically, the broadcasting-station information of RBDS broadcast waves is stored in a database supplemental memory like a RAM (Random Access Memory) provided separately from the database memory and the database is reconstructed based on the combined data stored in the supplemental memory and the database memory. This proposition is mentioned in, for example, "UNITED STATES RBDS STANDARD FOR BROADCAST DATA SYSTEMS, DRAFT NO. 1.4 NRSC DOCUMENT Jan. 10, 1992", particularly, in the section "3.1.3.6 Type 5 groups: Transparent data channels" starting from page 22. The present invention is adaptable to such a receiver which reconstructs the database based on RBDS broadcast waves, so that access to the database in this embodiment may be replaced with access to the reconstructed database.

According to the RBDS, transmission waves (broadcast waves) are generated in the form that accompanying control signals such as a PI (Program Identification) code for identifying a broadcasting station and a PTY (Program Type Code) for identifying or distinguishing a broadcasting program are frequency-divisionally multiplexed with an audio or voice signal as the main information signal. As shown in FIG. 3, PI is equivalent to a call sign in the database and PTY is equivalent to a format in the database.

Although this embodiment has been described with reference to the case where broadcasting-station information is limited to the call signs, formats and reception frequencies, this invention may of course be adapted to the case where other types of broadcasting-station information are used. Although the history memory 18 and BSM memory 19 in this embodiment have been described as separate memories, they may be constituted of the same memory. Although the history memory 18 is designed to store the information about a multistation grid by grid in this embodiment, the structure of this memory 18 may be modified. When database addresses are used as multistation-associated information to be stored, for example, the grid number (code) can be obtained from the associated database address. According to this invention, therefore, the history memory is not limited to the type which stores multistation-associated information grid by grid. In this case, the database address itself means that it is associated with a predetermined geographical range.

The receiving apparatus of this invention is not limited to the completely hardware-constructed design, but a part of the structure may be accomplished by software or hardware and software may be combined properly.

According to the receiving apparatus of the first aspect of this invention, as specifically described above, in the case where a reception position lies within a predetermined geographical range, if the reception frequency set for the tuning purpose matches with a reception frequency used by a plurality of broadcasting stations in the predetermined geographical range on the basis of data stored in the database memory and the reception of broadcast waves by tuning is detected, the set reception frequency is determined as the reception frequency of a multistation. When the reception frequency of the multistation has been determined, broadcasting-station information associated with one of those broadcasting stations using that reception frequency is selected based on data stored in the database memory, and the selected broadcasting-station information is sequentially stored together with the reception frequency as a reception history of the multistation.

With this design, the receiving apparatus can perform a responding operation which matches with the broadcasting program desired by a user as much as possible, so that broadcasting-station information which matches with a true broadcasting program received upon the reception of broadcast waves from a multistation can be easily presented without requiring an operation by the user.

According to the receiving apparatus of the second aspect of the present invention, broadcast waves of the specified program type are received, broadcasting-station information having the specified program type and the reception frequency of the received broadcast waves is read out from the database memory, and the read information is stored to the program-type associated memory in associated with reception level of the received broadcast waves. According to the receiving apparatus of the third aspect of the present invention, broadcasting-station information (target information) having the specified program type and the received broadcast waves is searched among from one or more pieces of broadcasting-station information corresponding to at least one predetermined unit geographical range including the receiving position on the basis of data stored in the database memory. In result, if no target information is acquired, the object to be searched is spread wider than the predetermined geographical range and the searching of the target information is performed again.

Therefore, it is possible to execute a format search which can efficiently attain broadcasting programs of the type desired by the user and with a high reception level.

What is claimed is:

1. A receiving apparatus having a database containing broadcasting-station information, comprising:

tuning means for tuning the receiving apparatus to receive broadcast waves at a set reception frequency;

a database memory in which broadcasting-station information having at least three types of data previously stored therein in association with geographical positional information, the three types of data including identification data on broadcasting stations, identification data on program types available from said broadcasting stations, and reception frequency data of said broadcasting stations;

multistation reception determining means for determining that said set reception frequency is a reception frequency of a multistation in a case where a reception position lies within a predetermined geographical range, said set reception frequency of said tuning means matches a reception frequency used by a plurality of broadcasting stations in said predetermined geographical range on the basis of data stored in said database memory, and reception of broadcast waves by said tuning means is detected;

selection means for selecting broadcasting-station information associated with one of said plurality of broadcasting stations using said set reception frequency according to said multistation reception determining means and said data stored in said database memory;

a multistation history memory for sequentially storing said broadcasting-station information associated with said multistation selected by said selection means with the reception frequency; and a controller for retrieving said broadcasting station information, wherein said controller retrieves said broadcasting station information from said database memory when said set reception frequency is not a reception frequency of a multistation, wherein said controller retrieves said broadcasting station information from said multistation history memory when said set reception frequency is a reception frequency of a multistation and when said multistation history memory contains broadcasting-station information associated with said multistation previously stored using said selection means.

2. The receiving apparatus according to claim 1, wherein said broadcasting-station information to be stored in said history memory are memory addresses indicative of memory positions of stored data in said database memory.

3. The receiving apparatus according to claim 1, further comprising display means for displaying broadcasting-station information stored in said history memory associated with said reception frequency of said multistation when said reception frequency of said multistation is determined.

4. The receiving apparatus according to claim 3, wherein said broadcasting-station information to be stored in said history memory are memory addresses indicative of memory positions of stored data in said database memory.

5. The receiving apparatus according to claim 3, wherein said display means displays, by priority, newly stored broadcasting-station information among those broadcasting-station information stored in said history memory and associated with said reception frequency of said multistation.

6. The receiving apparatus according to claim 5, wherein said broadcasting-station information to be stored in said history memory are memory addresses indicative of memory positions of stored data in said database memory.

7. The receiving apparatus according to claim 1, wherein the controller prompts a user to select said broadcasting-station information when said multistation history memory does not contain broadcasting-station information associated with said multistation and when said set reception frequency is a reception frequency of a multistation.

8. A receiving apparatus having a database containing broadcasting-station information, comprising:

a database memory in which broadcasting-station information comprising at least three types of data has been previously stored in association with geographical positional information, the three types of data including identification data on broadcasting stations, identification data on program types available from said broadcasting stations and reception frequency data on broadcast waves emitted from said broadcasting stations;

tuning means for tuning to broadcast waves at a set reception frequency;

means for generating an instruction for storing broadcasting-station information including a reception frequency in association with a specified program type;

means for setting a reception frequency in said tuning means while sweeping said reception frequency in response to said instruction;

means for detecting that broadcast waves have been received by tuning of said tuning means during sweeping; and a program-type associated memory for, when reception of broadcast waves is detected, reading broadcasting-station information having said specified program type and said reception frequency of said received broadcast waves from said database memory and storing said read broadcasting-station information in association with a reception level of said broadcast waves.

9. The receiving apparatus according to claim 8, further comprising means for reading, by priority, a reception frequency corresponding to a broadcasting program having a higher reception level from reception frequencies respectively corresponding to said specified program type and respectively stored in said program-type associated memory and setting said read reception frequency into said tuning means, in response to an instruction for receiving a broadcasting program of said specified program type.

\* \* \* \* \*